United States Patent [19]
Nakatsuka et al.

[11] Patent Number: 5,419,802
[45] Date of Patent: May 30, 1995

[54] ELECTRONIC COMPONENT SUPPLYING APPARATUS

[75] Inventors: Shigeki Nakatsuka, Kyoto; Manabu Morioka, Nara; Kunio Tanaka, Osaka; Takatoshi Mitsushima, Osaka; Sigetosi Negisi, Osaka; Takashi Munezane, Osaka, all of Japan

[73] Assignee: Matsushita Electric Industrial Co., Ltd., Osaka, Japan

[21] Appl. No.: 914,728

[22] Filed: Jul. 20, 1992

[30] Foreign Application Priority Data

Jul. 19, 1991 [JP] Japan ................... 3-179325
Jul. 19, 1991 [JP] Japan ................... 3-179326

[51] Int. Cl.⁶ ............................................. B65H 20/22
[52] U.S. Cl. .................................... 156/584; 156/344; 221/73; 221/87; 226/52; 226/115; 226/158; 414/416
[58] Field of Search .............. 156/584, 344, 541, 542; 221/25, 71, 72, 73, 87; 226/5, 8, 52, 120, 108, 115, 116, 158; 414/416

[56] References Cited

U.S. PATENT DOCUMENTS

| | | | |
|---|---|---|---|
| 3,034,692 | 5/1962 | Busch | 226/115 X |
| 3,911,646 | 10/1975 | Larkin et al. | 156/584 X |
| 4,116,747 | 9/1978 | Hamisch, Jr. | 156/541 X |
| 4,191,608 | 3/1980 | Bussard et al. | 156/541 X |
| 4,547,250 | 10/1985 | Murayama | 156/542 X |
| 4,572,421 | 2/1986 | Hug et al. | 226/108 X |
| 4,620,655 | 11/1986 | Fujita | 226/115 X |
| 4,735,341 | 4/1988 | Hamilton et al. | 226/115 X |
| 4,869,393 | 9/1989 | Soth | 226/115 X |
| 4,887,778 | 12/1989 | Soth et al. | 226/115 X |
| 4,943,342 | 7/1990 | Golemon . | |
| 5,014,498 | 5/1991 | McMahon | 226/108 X |

FOREIGN PATENT DOCUMENTS

| | | | |
|---|---|---|---|
| 0275927 | 7/1988 | European Pat. Off. . | |
| 61-18627 | 1/1986 | Japan . | |
| 633498 | 1/1988 | Japan . | |
| 63-178593 | 7/1988 | Japan . | |
| 1-145915 | 6/1989 | Japan | 156/541 |

*Primary Examiner*—Mark A. Osele
*Attorney, Agent, or Firm*—Lowe, Price, LeBlanc & Becker

[57] ABSTRACT

An apparatus capable of supplying electronic components successively to a loading position of an electronic component mounting machine at a high speed and in a stable manner is disclosed, in which a dancing guide is operatively connected with a feeding unit for taking out a predetermined length of the electronic-component tape from a supply reel before feed pins of the feed unit advance a carrier tape of the electronic-component tape to move a leading one of the electronic components into the loading position. Preferably, the apparatus further includes a separating unit, operatively connected with the feed unit, for separating an adhesive tape from the leading electronic component and the carrier tape before said feed pins advance the carrier tape. The separating unit is composed of a pair of spaced movable guide rollers and a fixed guide roller.

12 Claims, 11 Drawing Sheets

ELECTRONIC COMPONENT SUPPLYING APPARATUS

BACKGROUND OF THE INVENTION

1. Field of the Invention

The present invention relates to an electronic component supplying apparatus for use in an automatic electronic component mounting machine for supplying electronic components one at a time to the electronic component mounting machine which is constructed to automatically mount the electronic components on a printed circuit board.

2. Description of the Prior Art

Figure 18:
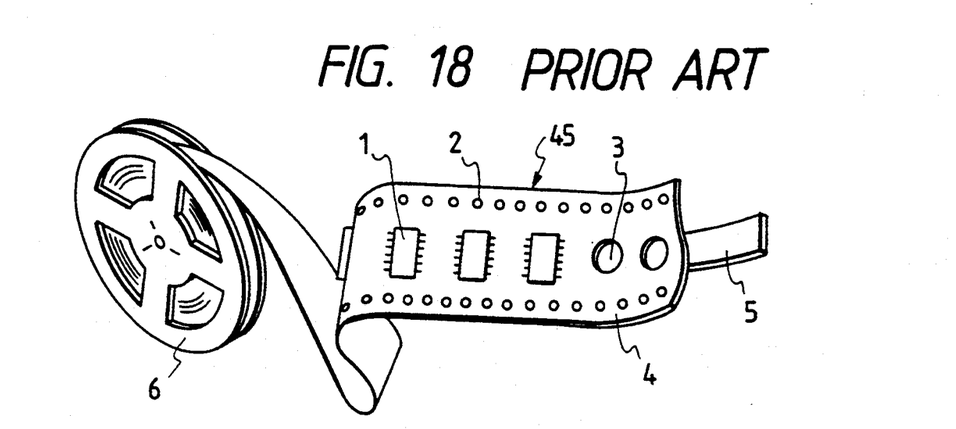
FIG. 18 is a schematic perspective view showing the construction of an electronic component tape used with the electronic component supplying apparatus, the electronic component tape including a series of electronic components held on a carrier tape by means of an adhesive tape.

FIG. 18 of the accompanying drawings shows, in perspective, a continuous electronic-component strip or tape 45 used with an electronic component supplying apparatus of the type concerned. The electronic-component tape 45 includes a series of electronic components 1, such as IC (integrated circuit) chips, held on a carrier tape 4 at equal longitudinal intervals by means of a pressure-sensitive adhesive tape 5 (hereinafter referred to as "adhesive tape") adhering to the individual electronic components 1 through a row of central stamped holes 3 formed in the carrier tape 4 in registry with the respective electronic components 1. Thus, the electronic components 1 of the electronic-component tape 45 has a pitch. The carrier tape has two rows of sprocket holes (feed holes) 2 and 2 formed along its opposite longitudinal edges at equal intervals. The electronic-component tape 45 is wound on a supply reel 6 before it is supplied to a user side at which the tape 45 is unwound from the supply reel 6 for supplying the electronic components 1 one after another to a loading station of an automatic electronic component mounting machine (not shown) for subsequent mounting of the electronic components 1 on a printed circuit board (not shown).

Figure 13:
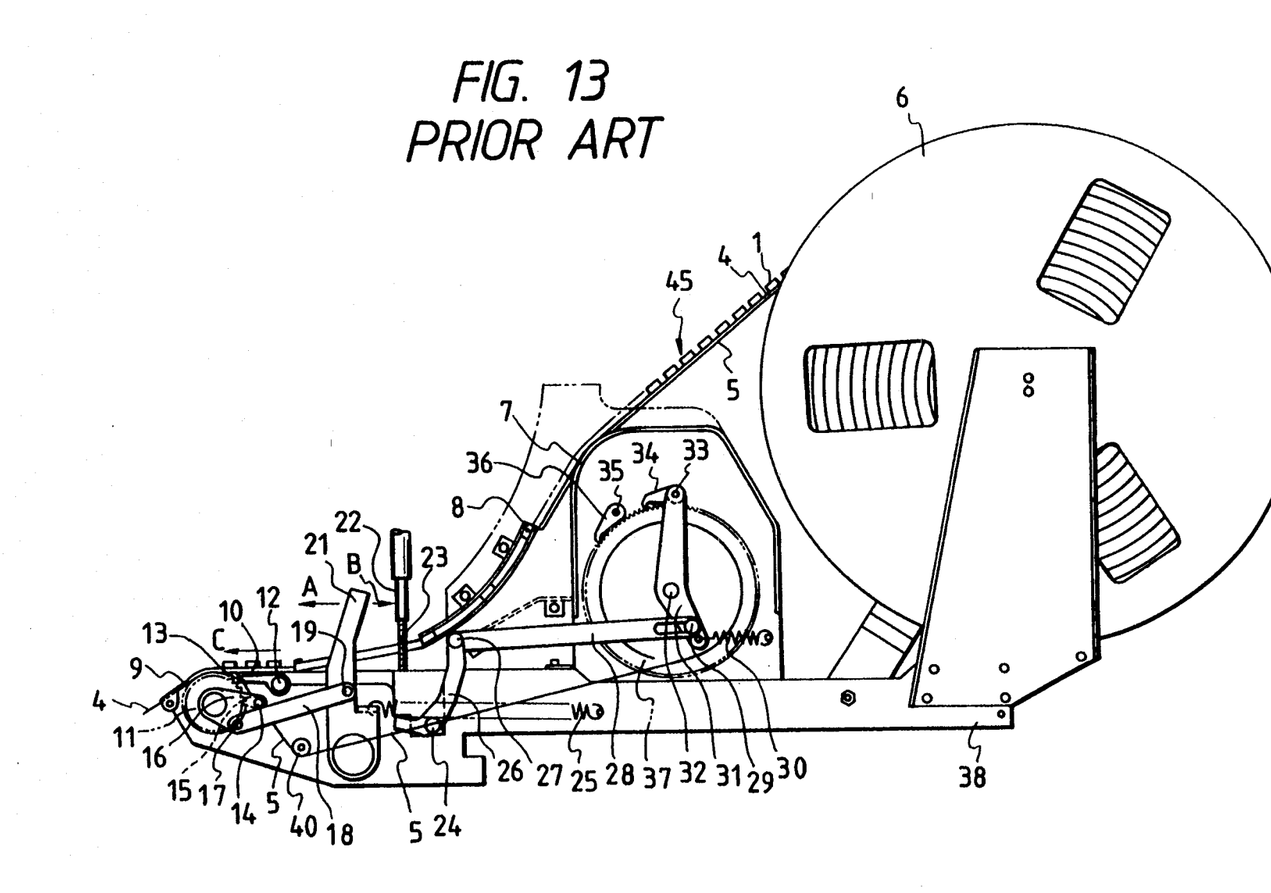
FIG. 13 is a schematic front elevational view of a conventional electronic component supplying apparatus.

FIG. 13 shows, in front elevation, a conventional electronic component supplying apparatus incorporated in the non-illustrated automatic electronic component mounting machine for supplying the electronic components 1 to a loading station of the automatic electronic component mounting machine where the supplied electronic component is picked up by a vacuum mounting head. In the electronic component supplying apparatus, the carrier tape 4 unwound from the supply reel 6 is guided through first and second guides 7 and 8 onto a feed ratchet 11. In response to rotation of the feed ratchet 11, two rows of pointed feed pins 43 (FIGS. 14–17) successively engage into the corresponding rows of feed holes 2 (FIG. 18), thereby feeding the carrier tape 4 forwardly. During that time, an arcuate tape presser 9 disposed above the feed ratchet 11 guides an upper surface of the carrier tape 4. At the same time, the adhesive tape 5 is pulled downward and subsequently guided in a direction opposite to the direction of movement of the carrier tape 4 by means of a guide 10 disposed below the tape presser 9. Thus, the adhesive tape 5 is separated from the electronic components 1 and the carrier tape 4. The separated adhesive tape 5 is, thereafter, taken up on a take-up reel 37.

When a kicker (not shown) of the electronic component mounting machine moves a pivotable actuating lever 21 in the direction of the arrow A shown in FIG. 13, a lever 18 which is pivoted at its one end by a pin 19 to the actuating lever 21 and, at its opposite end, by a pin 17 to a ratchet arm 16, turns the ratchet arm 16 in the clockwise direction whereupon a feed pawl 15 pivoted by a pin 14 to the ratchet arm 16 slides on teeth on the periphery of the feed ratchet 11 in the clockwise direction (which is opposite to the direction of feed of the carrier tape 4) by an angular distance equal to the pitch of the electronic components 1 of the electronic-component tape 45. A locking pawl 13 pivotable about a pin 12 is provided to prevent the reverse rotation (clockwise rotation) of the feed ratchet 11.

On the other hand, a pusher 22 slidably mounted on a frame 38 via a compression spring 23 is moved downward by an external power source (not shown) to lower one end of a lever 26 pivotally connected to the frame 38 by a pin 24, so that the lever 26 turns about the pin 24 in the counterclockwise direction. In response to the counterclockwise rotation of the lever 26, a connecting rod 28 which is pivoted at its one end by a pin 27 to the opposite end of the lever 26 and, at its opposite end, by a pin 29 to one end of a pivot lever 31, moves leftwards in FIG. 13 to turn the pivot lever 31 about a pin 32 in the clockwise direction. The opposite end of the pivot lever 31 is pivoted by a pin 33 to a feed pawl 34 so that the clockwise movement of the pivot lever 31 causes the feed pawl 34 to slide on teeth on the periphery of the take-up reel 37 by a predetermined angular distance equal to one or several pitches of the electronic components 45 of the electronic-component tape 45.

When the kicker releases the actuating lever 21, the actuating lever 21 returns in the direction of the arrow B in FIG. 13 under the force of a tension spring 25 with the result that the ratchet arm 16 is turned in the counterclockwise direction, thus causing the feed pawl 15 to turn the feed ratchet 11 in the tape feed direction (counterclockwise direction in FIG. 13) by the predetermined distance equal to the pitch of the electronic components 1 of the electronic-component tape 1. Due to this angular movement of the feed ratchet 11, the carrier tape 4 is fed by the feed pins 43 (FIGS. 14–17) of the feed ratchet 11 in the direction of the arrow C by a distance equal to the pitch of the electronic components 1 of the electronic-component tape 45.

On the other hand, the pusher 22 returns to its initial uppermost position. In response to the upward movement of the pusher 22, the feed pawl 34 turns the take-up reel 37 in the counterclockwise direction so that the adhesive tape 5 which has been separated from the electronic components 1 and the carrier tape 4 and guided to the position of the guide 10 is taken up via a guide roller 40 on the take-up reel 37 by a predetermined distance equal to the amount of feed of the carrier tape 4. A tension spring 30 serves to return the pivot lever 31 to its initial position when the pusher 22 moves upwards. A locking pawl 36 pivotable about a pin 35 is provided to prevent reverse rotation (clockwise rotation) of the take-up reel 37.

Operation of the conventional electronic component supply apparatus will be described below in greater detail with reference to FIGS. 14 through 17.

Figure 14:
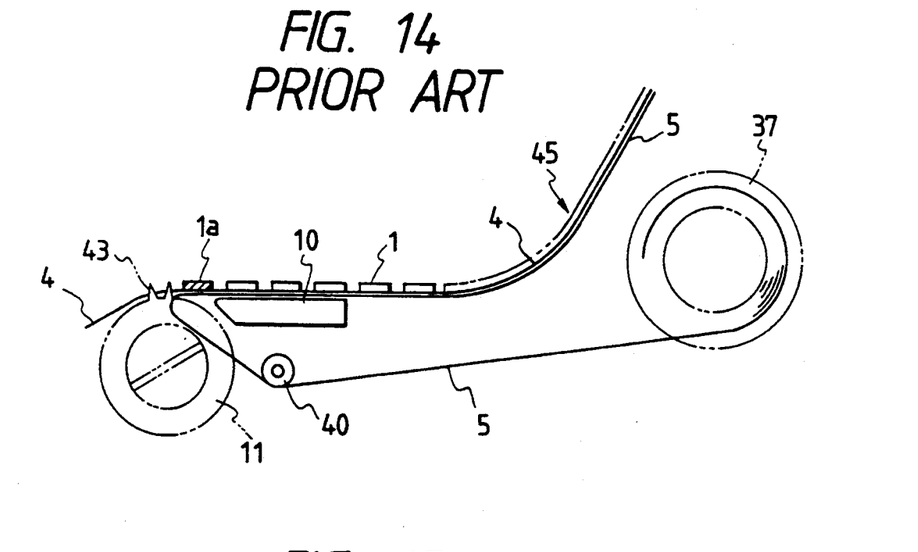
FIGS. 14 through 17 are diagrammatical views showing the manner in which an adhesive tape is peeled off on the conventional electronic component supplying machine.
Figure 15:
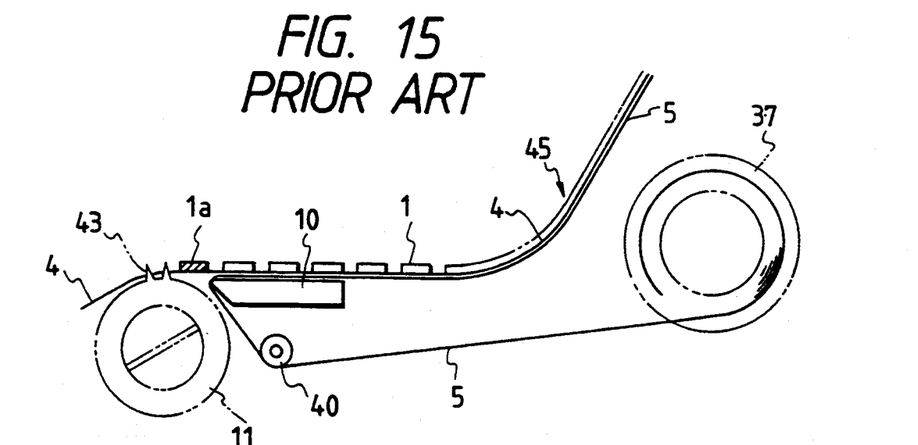

For purposes of illustration, operation of the apparatus begins with parts in the condition shown in FIG. 14 in which a leading electronic component 1a (indicated by hatching for clarity) is held on the carrier tape 4 by a holding power or adhesion of the adhesive tape 5. Then, while the leading electronic component 1a is held under suction by a vacuum mounting head (not shown) of the electronic component mounting machine, the take-up reel 37 is turned counterclockwise to take up the adhesive tape 5 by the predetermined distance. Thus, the adhesive tape 5 is separated from the leading electronic component 1a and the carrier tape 4, as shown in FIG. 15. To this end, the guide 10 is located at such a position that a predetermined length of the adhesive tape 5 is separated from the leading electronic component 1 and the carrier tape 4. Similarly, the guide roller 40 is located at such a position that the adhesive tape 5 is peeled off or separated from the leading electronic component 1a and the carrier tape 4 at an appropriate angle.

Figure 16:
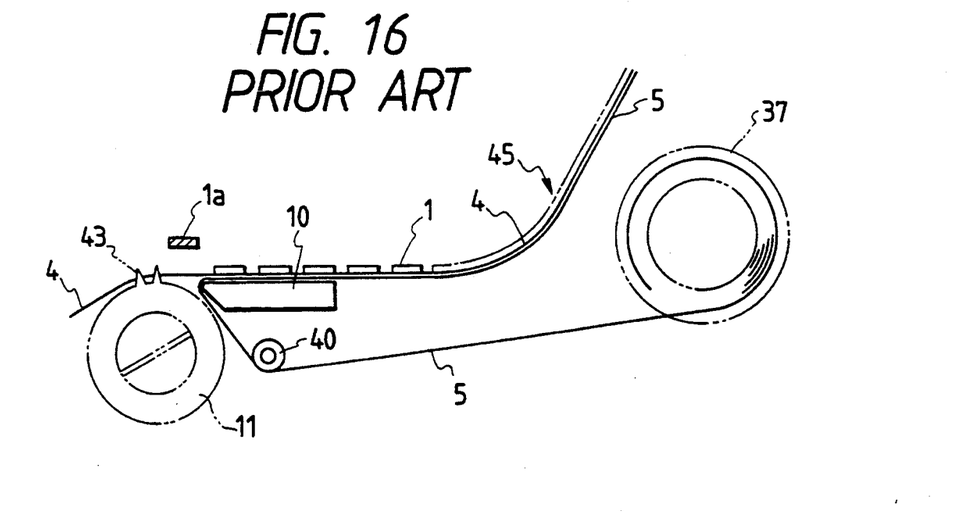
Figure 17:
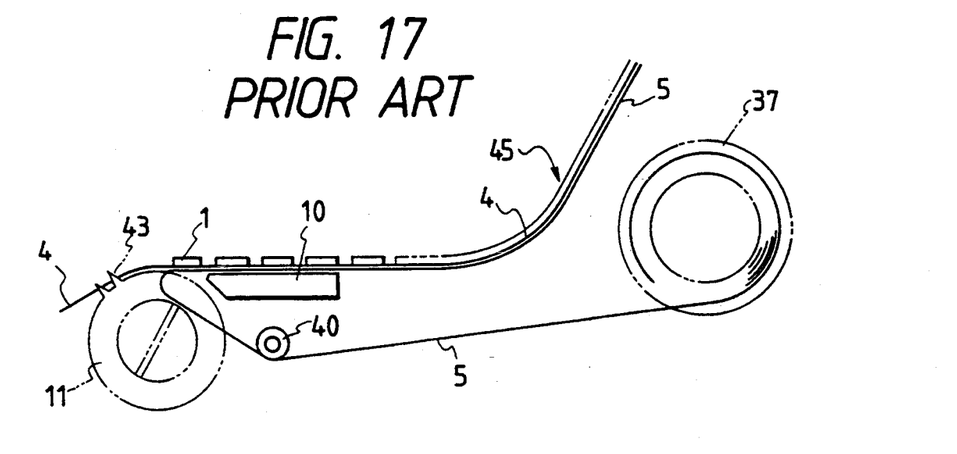

Subsequently, the leading electronic component 1a is picked up from the carrier tape 4 by means of the non-illustrated vacuum mounted head, as shown in FIG. 16. Then, the feed pawl 15 (FIG. 13) turns the feed ratchet 11 in the tape feed direction (counterclockwise direction) to advance the carrier tape 4 by a distance equal to the pitch of the electronic components 1 of the electronic-component tape 45. Thus, the next following electronic component 1 is brought into a supply position (loading station of the electronic component mounting machine), as shown in FIG. 17. In this instance, the adhesive tape 5 extends in a slackened condition.

The conventional electronic component supplying apparatus of the foregoing construction is not satisfactory because of drawbacks described below. A rotational force or torque of the take-up reel 37 produced by the action of the tension spring 30 is applied intermittently on the adhesive tape 5. Consequently, when the apparatus is operated at a higher speed to increase the electronic-component supply rate, the adhesive tape 5 is likely to be broken or ruptured due to a tension or pulling force applied abruptly. Thus, a spring force of the tension spring 30 must be determined with due consideration of a shock exerted on the adhesive tape 5 when the adhesive tape 5 is peeled off from the leading electronic component 1a and the carrier tape 4. However, if the adhesive tape 5 has a holding force and a tensile strength that vary irregularly along the length of the adhesive tape 5, it becomes substantially impossible to appropriately set the spring force of the tension spring 30.

In addition, when the adhesive tape 5 has a large holding force, and when the electronic components 1 are small in size, the electronic components 1 tend to be pulled into the corresponding stamped holes 3 when adhesive tape 5 is pulled downwards in response to the intermittent counterclockwise rotation of the take-up reel 37. Furthermore, since the carrier tape 4 while being advanced by the feed pins 43 on the feed ratchet 11 is subjected to a back tension produced mainly by the weight of the supply reel 6, the carrier tape 4 tends to become ruptured from the feed holes 2 when a heavy supply reel 6 is used or when the electronic-component supply rate is increased. Once such rupturing occurs, it is no longer possible to supply the electronic components 1 reliably to the electronic component mounting machine.

SUMMARY OF THE INVENTION

With the foregoing drawbacks of the prior art in view, it is an object of the present invention to provide an apparatus for supplying electronic components one at a time to an electronic component mounting machine stably at a high speed by automatically separating an adhesive tape from the electronic components held on a carrier tape by the adhesive tape.

An apparatus according to this invention for supplying electronic components one at a time to a loading position of an electronic component mounting machine includes means for rotatably holding a supply reel on which an electronic-component tape is wound, the electronic-component tape including a series of electronic components held on a carrier tape at a constant pitch by a pressure-sensitive adhesive tape, the carrier tape having two rows of feed holes formed along its opposite longitudinal edges at equal longitudinal intervals. The apparatus further includes means for guiding the electronic-component tape as it is fed from the supply reel toward the loading position, and means for feeding the electronic components of the electronic-component tape one after another to the loading position, the feeding means including two rows of feed pins successively engageable with the rows of feed holes of the carrier tape and movable to advance the carrier tape intermittently by a distance equal to the pitch of the electronic components of the electronic-component tape. A taking-up means is operatively connected with the feeding means for taking out a predetermined length of the electronic-component tape from the supply reel before the feed pins advance the carrier tape to move a leading one of the electronic components into the loading position.

Preferably, the taking-out means is a pivotally movable dancing guide disposed between the holding means and the feed means. The dancing guide is releasably engageable with the electronic-component tape to take out the predetermined electronic-component tape length from the supply reel.

The apparatus further includes means, operatively connected with the feed means, for separating the adhesive tape from the leading electronic component and the carrier tape before the feed pins advance the carrier tape to move the leading electronic component into the loading position, and means, operatively connected with the feed means and disposed downstream of the separating means, for intermittently taking up the adhesive tape by the distance equal to the pitch of the electronic components of the electronic-component tape.

Preferably, the separating means includes concurrently movable first and second guide rollers spaced in a direction parallel to the direction of advance of the carrier tape, and a fixed third guide roller. The first, second and third guide rollers are arranged such that the adhesive tape is guided successively around the first guide roller, the second guide roller and the third guide roller while turning in alternate directions around the respective guide rollers. The first and second guide rollers are reciprocally movable in the direction between a first position in which the first guide roller is disposed downstream of the loading position and the second guide roller is disposed upstream of the loading position, and a second position in which the first and second guide rollers are disposed upstream of the loading position. The first and second guide rollers are normally disposed in the first position and are operated to move from the first position to the second position before the carrier tape is advanced by the feed pins.

The above and other objects, features and advantages of the present invention will become more apparent from the following description when making reference to the detailed description and the accompanying sheets of drawings in which a preferred structural embodiment incorporating the principles of the present invention is shown by way of illustrative example.

DETAILED DESCRIPTION OF THE INVENTION

Figure 1:
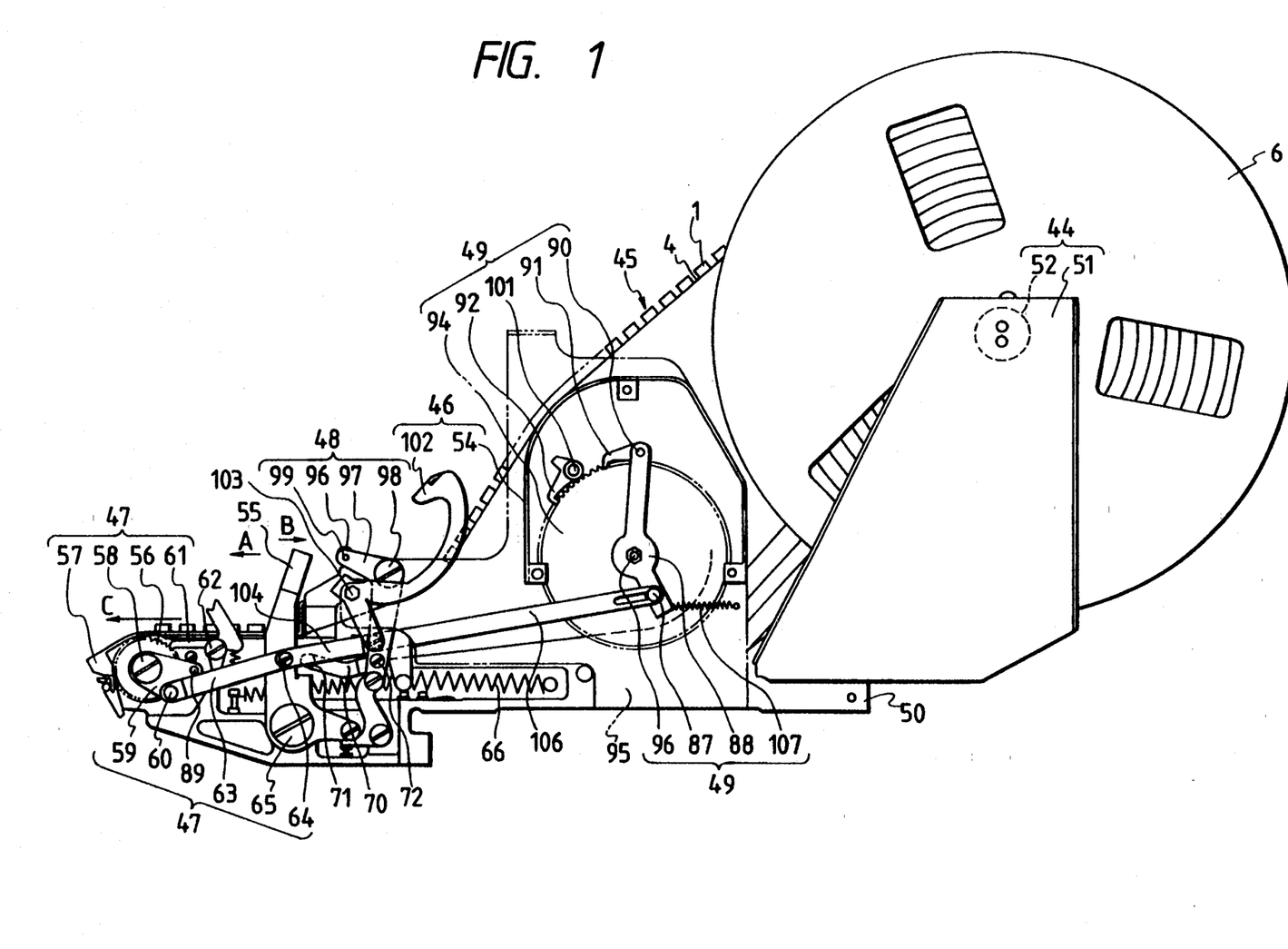
FIG. 1 is a schematic front elevational view of an electronic component supplying apparatus according to an embodiment of the present invention.

Referring now to the drawings, wherein like reference characters designate like or corresponding parts throughout the several views, FIG. 1 shows an apparatus incorporated in an automatic electronic component mounting machine (not shown) for supplying electronic components one at a time to a loading position of the automatic electronic component mounting machine.

The electronic component supplying apparatus includes an elongate main frame 50 made, for example, of an aluminum alloy and extends horizontally. An upright reel support plate 51 is attached to an end (right end in FIG. 1) of the main frame 50 and has a horizontal reel shaft 52 at its upper end. A supply reel 6 on which an electronic component tape 45 is wound is rotatably mounted on the reel shaft 52. The reel shaft 52 and the reel support plate 51 constitute a holding means or unit 44. The electronic component tape 45, as described above with reference to FIG. 18, includes a series of electronic components 1 held on a carrier tape 4 by an adhesive tape 5 in registry with a row of stamped holes 3 through which the adhesive tape 5 adheres to the individual electronic components 1. The stamped holes 3 are formed at equal internals along the length of the carrier tape 4 and arranged centrally between two rows of sprocket holes (feed holes) 2 formed along opposite longitudinal edges of the carrier tape 4. The electronic components 1 of the electronic-component tape 45 has a constant pitch.

A horizontally inverted L-shaped side plate 95 is disposed on an upper surface of a central portion of the main frame 50, with its vertical arm disposed adjacent to the reel support plate 51, for supporting thereon a guide means or unit 46.

The guide unit 46 includes an arcuate guide strip 54 attached to the vertical arm of the L-shaped side plate 95, and an arcuate dancing guide 102 disposed downstream of the guide strip 54 and pivotally connected by a horizontal pin 103 to a horizontal arm of the L-shaped side plate 95. The guide strip 54 has an arcuate front upper surface 54a (FIG. 2) engageable with an under surface of the electronic-component tape 45 for guiding therealong the electronic-component tape 45 as the electronic-component tape 45 is fed forwardly. The dancing guide 102 has an arcuate under surface 102a (FIG. 2) engageable with a front surface of the electronic-component tape 45 for guiding the electronic-component tape 45 as the electronic-component tape 45 is fed forwardly. The dancing guide 102 also serves as a taking-out means for taking out a predetermined length of the electronic-component tape 1 from the supply reel 6 before the carrier tape 4 is advanced by a distance equal to the pitch of the electronic components 1 for bringing a leading electronic component to the loading position of the electronic component mounting machine, as described later.

A feed means or unit 47 for feeding the carrier tape 4 of the electronic component tape 45 is disposed on the opposite end (left end in FIG. 1) of the frame 50 which is remote from the reel support plate 51. The feed unit 47 includes an actuating lever 55 pivotally connected by a horizontal support pin 65 to the frame 50. The actuating lever 55 has an intermediate portion to which one end of a first connecting lever 63 and one end of a second connecting lever 104 are pivotally connected by a pin 64. The other end of the second connecting lever 104 is pivoted to the dancing guide 102. The other end of the first connecting lever 63 is pivotally connected by a pin 60 to a ratchet arm 59 which is pivoted by a pin 58 to a feed ratchet 56. The feed ratchet 56 is rotatably mounted on the frame 50 by the pin 58 so that the ratchet arm 59 is pivotally movable about the axis of the rotation of the feed ratchet 56. A feed pawl or catch 86 (FIG. 2) is pivotally connected by a pin 89 to a free end of the ratchet arm 59 and meshing with teeth on the periphery of the feed ratchet 56 for intermittently rotating the feed ratchet 56 in the counterclockwise direction. A locking pawl 61 pivoted to the frame 50 by a pin 62 meshes with the teeth of the feed ratchet 56 to prevent the feed ratchet 56 from rotating in the clockwise direction. The feed ratchet 56 of the feed unit 47 is disposed adjacent to the loading position of the electronic component mounting machine so that a leading one of the electronic components 1 is located at the loading position where it is picked up by a vacuum mounting head (not shown) of the electronic component mounting machine. The feed ratchet 56 has on its periphery two rows of pointed feed pins 56a (FIGS. 4–12) engageable with the feed holes 2 of the carrier tape 4 for feeding the carrier tape 4 downstream across the loading station. The feed unit 47 further includes a tape presser 57 disposed above the feed ratchet 56 for guiding an upper surface of the carrier tape 4 as it is advanced through the loading station.

Figure 3:
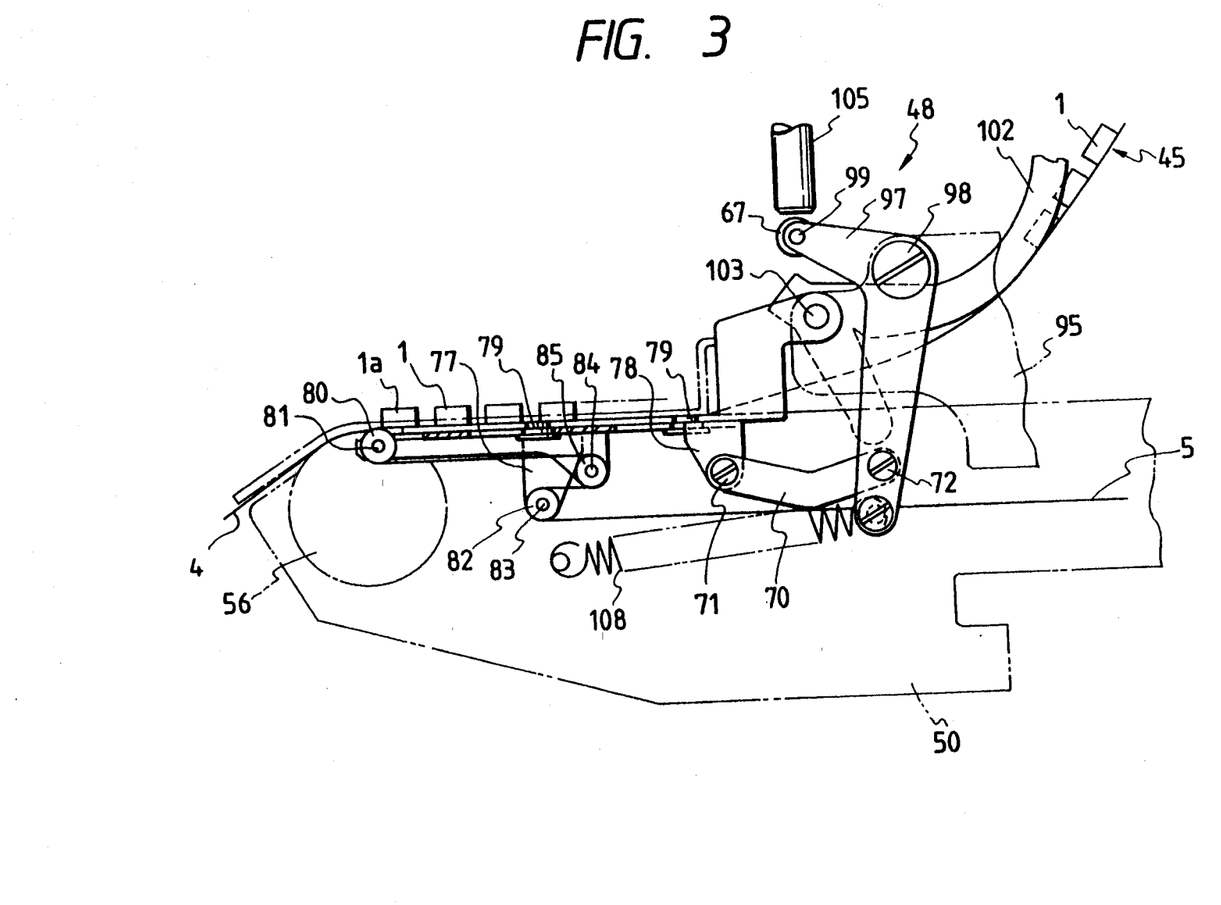
FIG. 3 is an enlarged view illustrating an adhesive tape separating unit of the electronic component supplying apparatus.

A separating means or unit 48 for separating the adhesive tape 5 from the electronic components 1 and the carrier tape 4 is disposed on a forward end portion of the L-shaped side plate 95 disposed downstream of the dancing guide 102. The separating unit 48, as best shown in FIG. 3, includes an inverted L-shaped lever 97 pivotally connected at its central portion to the side plate 95 by a horizontal support pin 98. The lever 97 has a roller 67 rotatably mounted on one end of the lever 97 by means of a pin 99. The L-shaped lever 97 is urged to turn about the pin 98 in the clockwise direction by means of a tension spring 108 acting between the main frame 50 and the other end of the lever 97. A link 70 has one end pivotally connected by a pin 72 to the lever 97 adjacent to the other end thereof. The other end of the link 70 is pivotally connected by a pin 71 to a rear end of an elongate slide plate 78. The slide plate 78 is movably connected by a pair of pins 79 to a bracket 77 secured to the main frame 50. The slide plate 78 is slidably movable relative to the bracket 77 in a direction parallel to the direction of feed of the carrier tape 4. A first guide roller 80 and a second guide roller 85 are mounted on a forward end (left end in FIG. 3) and an intermediate portion, respectively, of the elongate slide plate 78 by means of a first pin 81 and a second pin 84. A third guide roller 82 is rotatably mounted on a forward end of the bracket 77 by means of a pin 83. Since the slide plate 78 is movable relative to the bracket 77, the first and second guide rollers 80 and 85 are movable relative to the third guide roller 82 in the direction parallel to the direction of feed of the carrier tape 4. The first, second and third guide rollers 80, 85 and 82 are arranged such that the adhesive tape 5 separated from the electronic components 1 and the carrier tape 4 is guided successively around the first guide roller 80, the second guide roller 85, and the third guide roller 82 while turning in alternate directions around the respective guide rollers 80, 85, 82, and subsequently taken up by a take-up means or unit 49. Preferably, these guide rollers 80, 85, 82 are disposed such that a portion of the adhesive tape 5 extending from the first guide roller 80 to the second guide roller 85 extends parallel to a portion of the adhesive tape 5 extending from the second guide roller 85 to the third guide roller 82.

Figure 2:
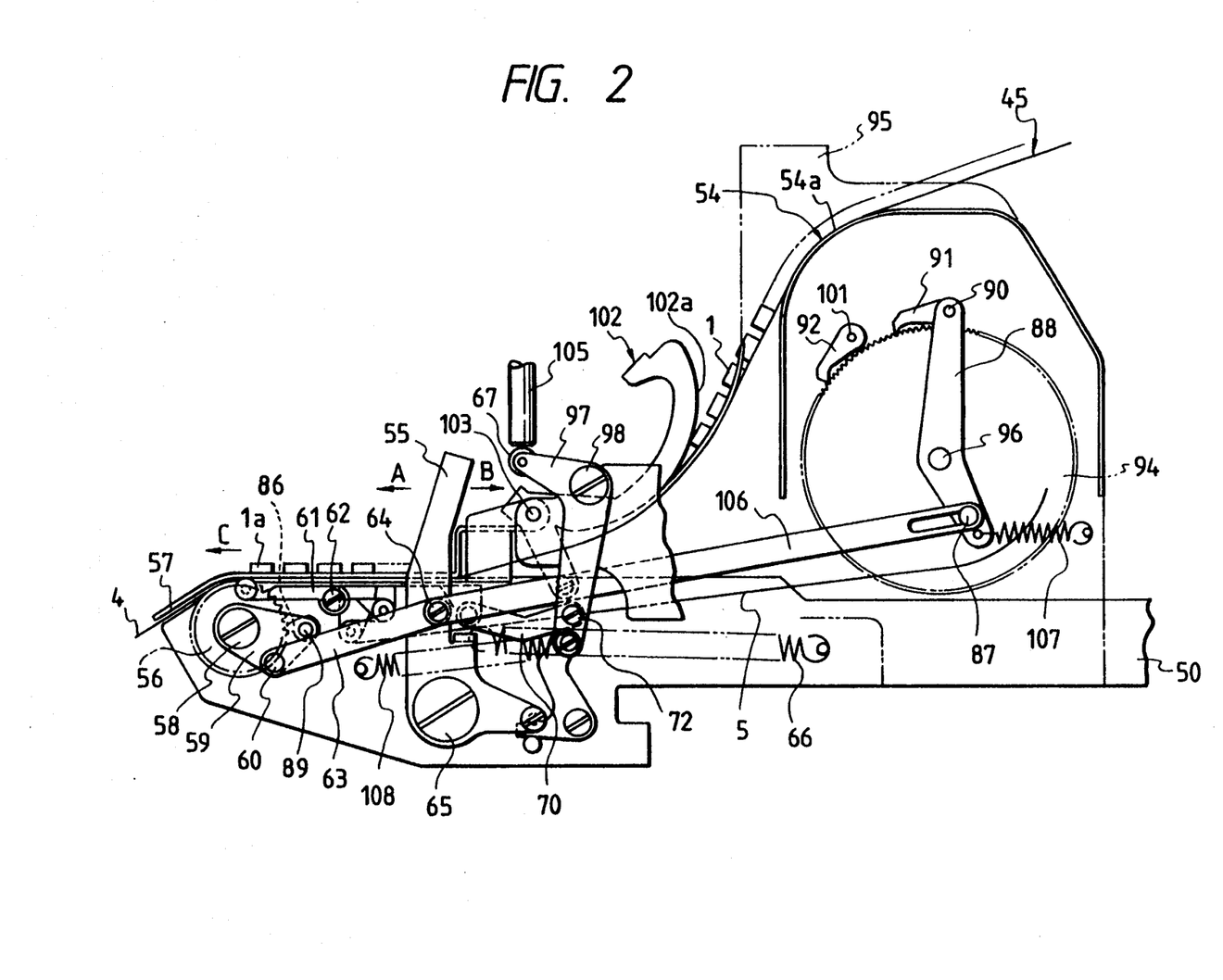
FIG. 2 is an enlarged view of a main portion of the electronic component supplying apparatus.

The take-up unit 49, as best shown in FIG. 2, includes a take-up ratchet 94 rotatably mounted on the vertical arm of the side plate 95 by a horizontal pin 96, a ratchet arm 88 pivotally movable about the pin 96, a feed pawl or catch 91 pivotally connected by a pin 90 to one end of the ratchet arm 88 and meshing with teeth on the periphery of the take-up ratchet 94 for intermittently rotating the take-up ratchet 94 in the counterclockwise direction, and a locking pawl 92 pivotally mounted by a pin 101 on the side plate 95 and meshing with the teeth of the take-up ratchet 94 for preventing the take-up ratchet 94 from rotating in the clockwise direction. The other end of the ratchet arm 88 is linked by a pin 87 to one end of a third connecting lever 106, the other end of the third connecting lever 106 being pivoted by the pin 64 to the actuating lever 55. The ratchet arm 88 is normally held in the upright position shown in FIG. 2 by the force of a tension spring 107 extending between the other end of the ratchet arm 89 and the side plate 95.

The electronic component supplying apparatus of the foregoing construction operates as follows.

For purposes of illustration, the operation of the apparatus begins with parts in the condition shown in FIGS. 2 and 3 in which the electronic-component tape 45 wound on the supply reel 6 is guided through the guide unit 49 onto the feed unit 47 such that a loading one 1a of the electronic components 1 is located at the loading position of the electronic component mounting machine. The adhesive tape 5 is guided successively around the first, second and third guide rollers 80, 85 and 82 and connected at its leading end to the take-up unit 49. The slide plate 78 of the separating unit 48 is disposed in its advanced position in which the first guide roller 80 is located downstream of the loading electronic component 1a so that the leading electronic component 1a is held on the carrier tape 4 by the adhesive tape 5. Then, the actuating lever 55 and the lever 97 are driven by a horizontally movable kicker (not shown) and a vertically movable pusher 105, respectively, of the electronic component mounting machine (not shown) in synchronism with the operation of the electronic component mounting machine, whereupon the electronic component supplying apparatus starts operating in a manner described below.

Figure 9:
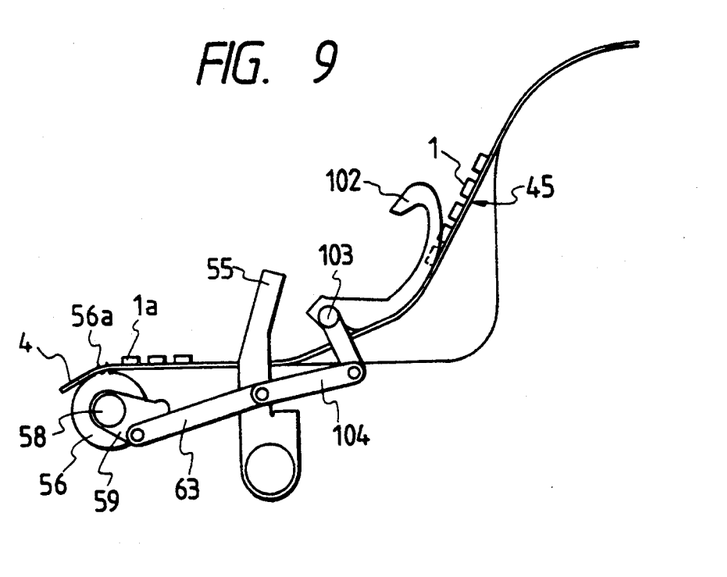
FIGS. 9 through 12 is a diagrammatical views illustrative of the operation of a feed unit and a dancing guide of the electronic component supplying apparatus.
Figure 10:
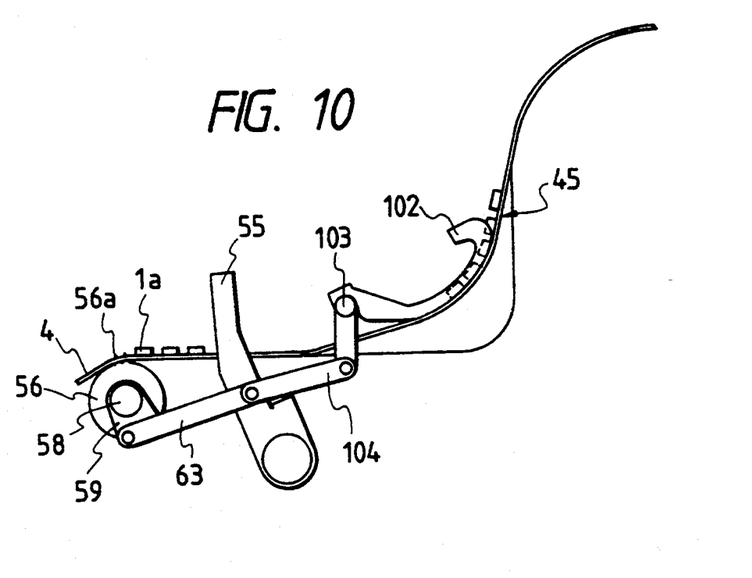

The actuating lever 55 is forced by the kicker to pivot or turn in the direction of the arrow A in FIG. 2 against the force of a tension spring 66 whereupon the ratchet arm 59 connected to the connecting lever 63 turns clockwise about the pin 58 from the upright position shown in FIGS. 2 and 9 to the tilted position shown in FIG. 10. During that time, since the feed ratchet 56 is locked by the locking pawl 61 (FIG. 1) against clockwise rotation, the feed pawl 86 connected to the ratchet arm 59 slides in the clockwise direction on the teeth of the feed ratchet 56 by an angular distance equal to the pitch of the electronic components 1 of the electronic-component tape 1 and then moves again into meshing engagement with the teeth of the feed ratchet 56. The foregoing pivotal movement of the actuating-lever 55 also causes the dancing guide 102 to turn clockwise about the pin 103, so that a portion of the electronic-component tape 45 extending between the feed ratchet 56 and the supply reel 6 is forced downwards by the dancing guide 102. Since the leading end of the carrier tape 4 is engaged by the feed pins 56a on the feed ratchet 56 which is held immovable, a predetermined length of the electronic-component tape 45 is taken out from the supply reel 6 by the clockwise angular movement of the dancing guide 102.

The pivotal movement of the actuating lever 55 in the counterclockwise direction further causes the ratchet arm 88 of the take-up unit 49 to turn about the pin 96 in the clockwise direction in FIG. 2, against the force of the tension spring 107. Thus, the feed pawl 91 connected to the ratchet arm 88 slides in the clockwise direction on the teeth of the take-up ratchet 94 through a predetermined angular distance equal to the pitch of the electronic components 1 of the electronic-component tape 1. The feed pawl 91 then moves again into meshing engagement with teeth of the take-up ratchet 94. During that time, a vacuum mounting head (not shown) of the electronic component mounting machine holds the leading electronic component 1a by a suction force.

Figure 11:
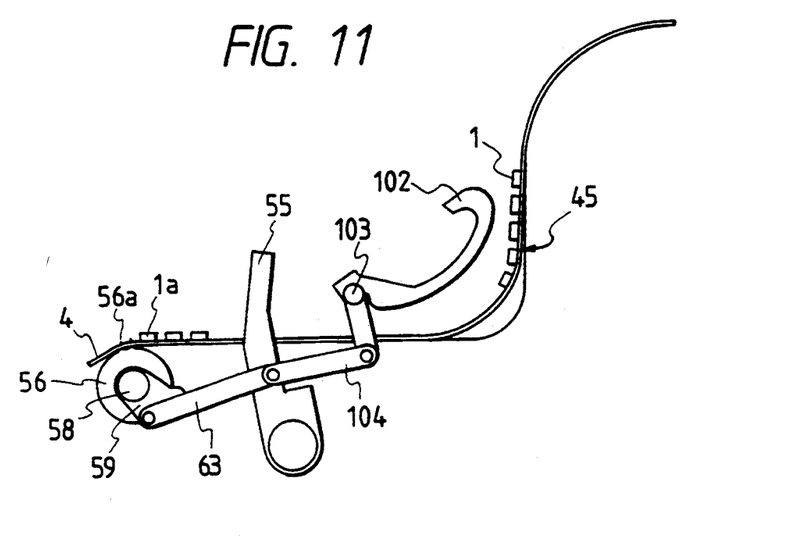
Figure 12:
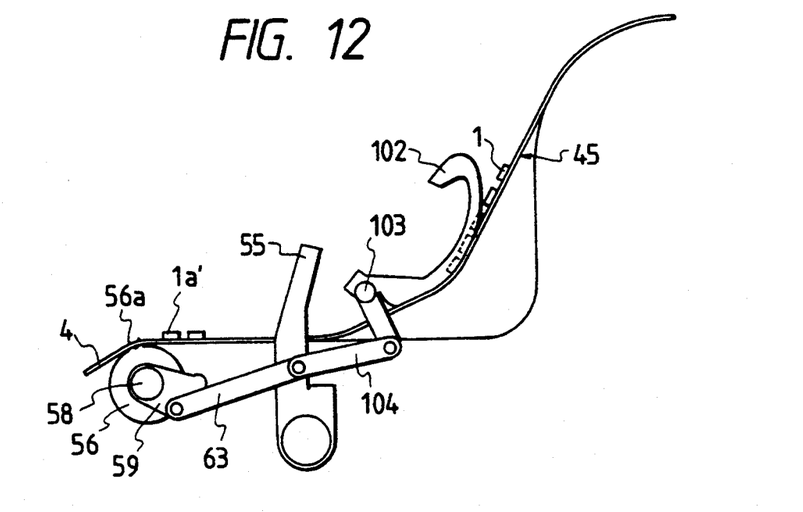

Then, the kicker releases the actuating lever 55 whereupon the actuating lever 55 pivots back from the tilted position shown in FIG. 10 toward the upright position shown in FIG. 12 under the force of the tension spring 66. During that time, in response to the pivotal movement of the actuating lever 55, the dancing guide 102 turns counterclockwise about the pin 103, thus releasing the electronic-component tape 45, as shown in FIG. 11. As readily seen in FIG. 11, for a short while the dancing guide 102 lifts physically away from and therefore ceases contact with the carrier tape, thereby relieving tension thereon. At the same time, the feed pawl 86 (FIG. 2) connected to the ratchet arm 56 turns the feed ratchet 56 in the counterclockwise direction, thereby advancing the relieved carrier tape 4 through the loading station of the electronic component mounting machine. When the actuating lever 55 arrives at its original upright position shown in FIG. 12, a predetermined length of the carrier tape 4 of the electronic-component tape 45 which is equal to the pitch of the electronic components 1 of the electronic-component tape 1 has been advanced through the loading station of the electronic component mounting machine, and the electronic-component tape 45 is again held in contact with the arcuate under surface 102a of the dancing guide 102.

As described above, since the predetermined length of the electronic-component tape 45 is taken out by the dancing guide 102 from the supply reel 6 before the carrier tape 4 of the electronic-component tape 45 is advanced by the feed ratchet 56, and since the predetermined electronic-component tape length is kept free (under no-load or slackened condition) during the feed of the carrier tape 4, the electronic-component tape 45 can be fed stably and smoothly without damaging or otherwise rupturing the feed holes 2 of the carrier tape 4 even when the electronic component supplying apparatus is operated at a high speed in synchronism with the operation of the electronic component mounting machine or when a heavy supply reel 6 is used for a purpose of mass-production of the electric circuit board assembly.

When the actuating lever 55 returns from the tilted position (FIG. 10) to the original upright position (FIG. 12), the ratchet arm 88 of the take-up unit 49 turns counterclockwise about the pin 96 under the force of the tension spring 107. With this counterclockwise movement of the ratchet arm 88, the feed pawl 91 connected to the ratchet arm 88 turns the take-up ratchet 94 in the counterclockwise direction through the predetermined angular distance equal to the pitch of the electronic components 1 of the electronic-component tape 45. Thus, a length of the adhesive tape 5 which is equal to the pitch of the electronic components 1 of the electronic-component tape 45 is taken up by the take-up unit 49.

Figure 4:
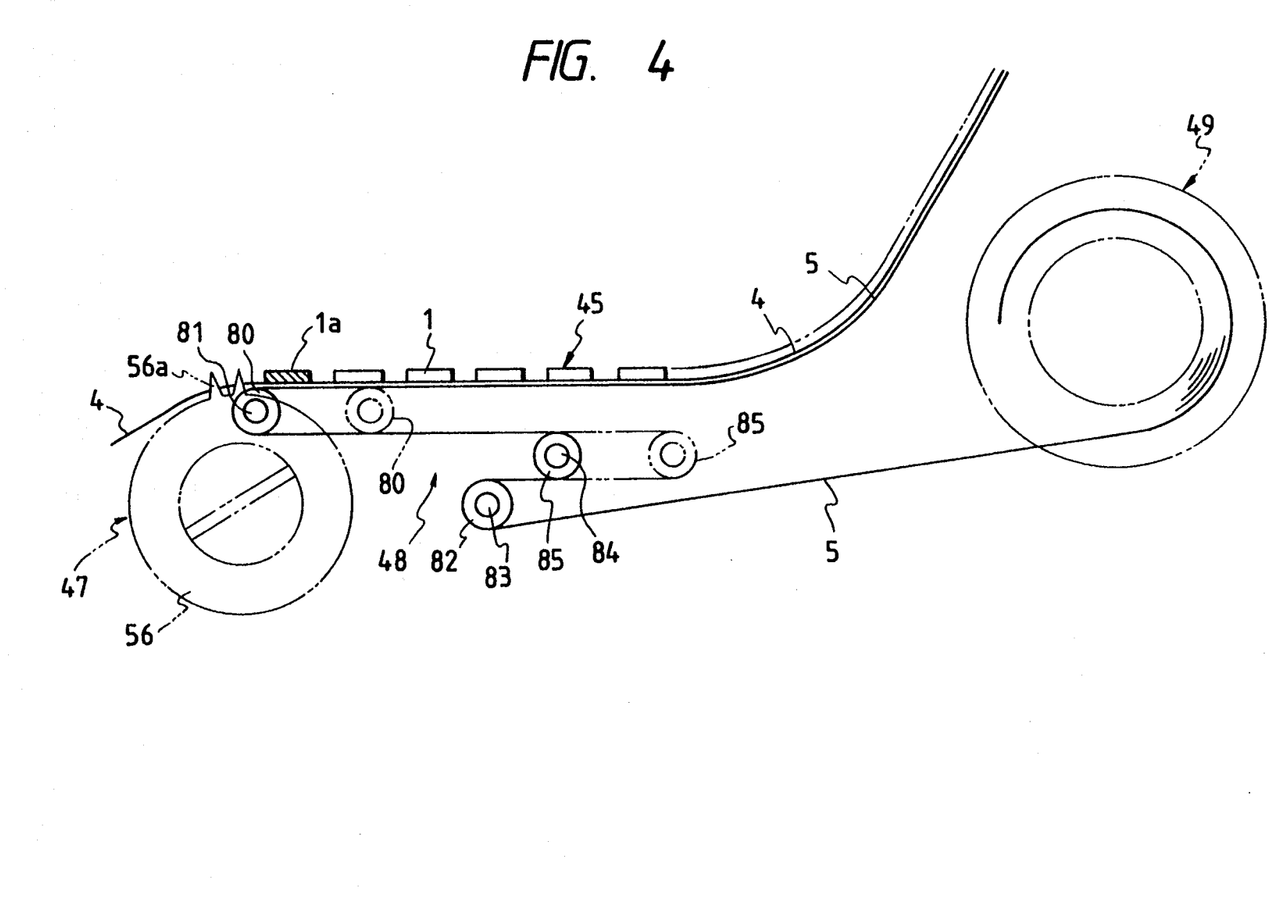
FIG. 4 is a diagrammatical view illustrative of the manner in which an adhesive tape is peeled off or separated from electronic components and a carrier tape and taken up on a take-up reel according to the present invention.
Figure 5:
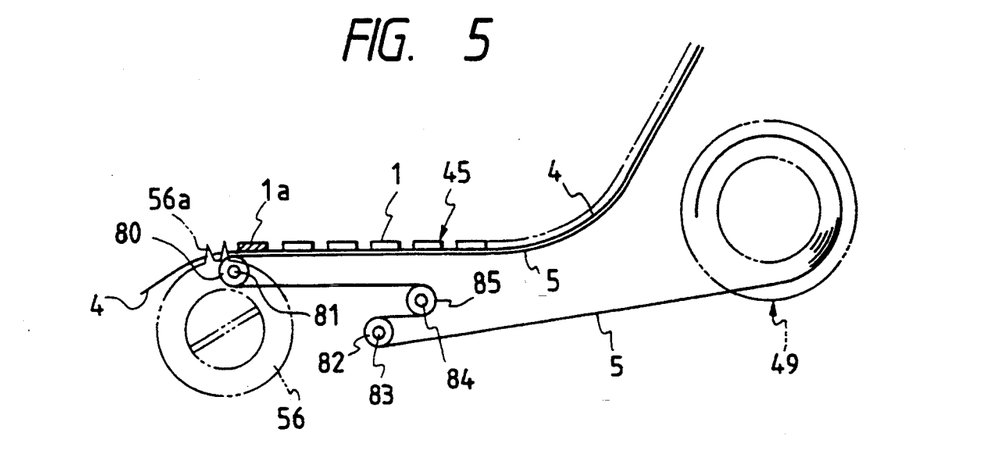
FIGS. 5 through 8 are diagrammatical views showing a sequence of operations of an adhesive tape separating unit.
Figure 6:
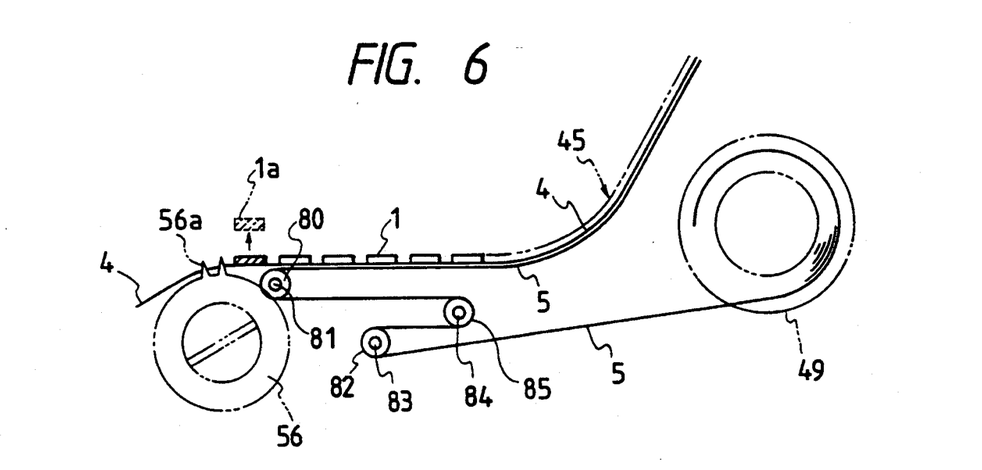
Figure 7:
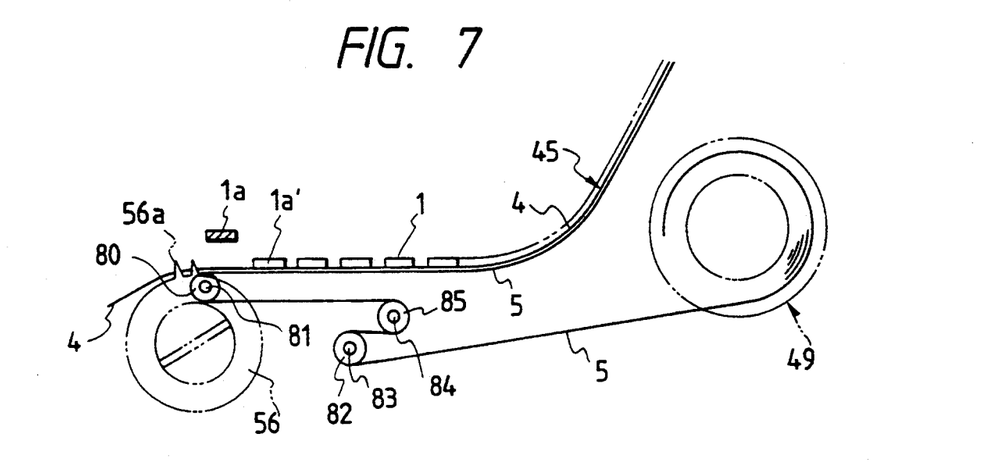

On the other hand, when the pusher 105 shown in FIG. 3 moves downwards, the lever 97 turns counterclockwise about the pin 98 against the force of the tension spring 108. In response to this pivotal movement of the lever 97, the slide-plate 78 connected by the link 70 to the lever 97 moves from its advanced position (FIGS. 3 and 5) to a retracted position (FIG. 6) which is spaced from the loading station in a direction opposite to the direction of feed of the carrier tape 4 by a distance equal to the pitch of the electronic components 1 (or a pitch of the stamped holes 3) of the electronic-component tape 45. With this movement of the slide plate 78, the first and second guide rollers 80 and 85 move in a direction opposite to the direction of feed of the carrier tape 4 so that the adhesive tape 5 is separated from the leading electronic component 1a and the carrier tape 4. As shown in FIG. 4, in spite of the movement of the first and second guide rollers 80 and 85 from the solid-lined advanced position to the phantom-lined retracted position, the length of a portion of the adhesive tape 5 extending from the carrier tape 4 through the first and second guide rollers 80 and 85 to the third guide roller 82 remains unchanged. Thus, the adhesive tape 5 is not subjected to undue tension or made to slacken as it is separated from the leading electronic component 1a and the carrier tape 4. The leading electronic component 1a released from the adhesive tape 5 is picked up from the carrier tape 4 and then transferred to a desired mounting position of a printed circuit board by the vacuum mounting head of the electronic component mounting machine.

Then, the pusher 105 returns to its initial uppermost position shown in FIG. 3, whereupon the lever 97 turns clockwise about the pin 98 by the force of the tension spring 108. In response to this pivotal movement of the lever 97, the slide plate 78 returns from the retracted position (FIG. 6) to the advanced position (FIG. 7) so that the first and second guide rollers 80 and 85 move in the direction of feed of the carrier tape 4. With this movement of the first and second guide rollers 80 and 85, the length of a portion of the separated adhesive tape 5 extending from the carrier tape 4 through the first and second guide rollers 80 and 85 to the third guide roller 82 is kept unchanged. During the movement of the first and second guide rollers 80 and 85, the separated adhesive tape portion is not tensioned, nor does it become slacken. The upward movement of the pusher 105 takes place before the kicker releases the actuating lever 55 from the tilted position shown in FIG. 10

Figure 8:
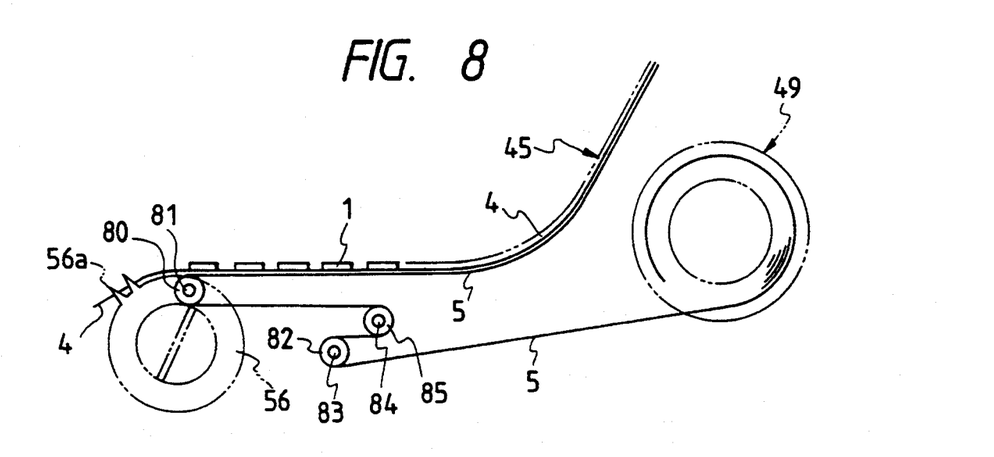

Subsequently, the feed ratchet 56 is turned counterclockwise by the predetermined angular distance equal to the pitch of the electronic components 1 of the electronic-component tape 1 so that the next following electronic component 1a' held on the carrier tape 4 is brought to the loading position, as shown in FIG. 8. At the same time, the take-up ratchet 94 (FIG. 2) of the take-up unit 49 is turned counterclockwise to take-up the adhesive tape 5 by a distance equal to the pitch of the electronic components 1 of the electronic-component tape 45. In this instance, since the adhesive tape 5 has already been separated from the carrier tape 4 by the separating unit 48, as described above, the taking-up operation can be performed smoothly without exerting undue tension on the adhesive tape 5 even when the electronic component supply apparatus is operated at a high speed.

In the illustrated embodiment, the electronic-component tap 45 includes electronic components 1 held on a carrier tape 4 at a constant pitch by means of an adhesive tape 5 adhering to the respective electronic components 1 through stamped holes 3 formed in the carrier tape 4. The form of the electronic-component tape 45 is not limited to that of the disclosed embodiment. Rather, the electronic component supplying apparatus of the present invention is effectively operative when used with a different electronic-component tape in which electronic components are held on a carrier tape by an adhesive tape adhering to leads of the individual electronic components, or the electronic components are held by embossing on a carrier tape.

As described above, according to the electronic component supplying apparatus of this invention, a pair of spaced guide rollers of the separating unit moves in a direction opposite to the direction of feed of the carrier tape to separate the adhesive tape from a leading electronic component and the carrier tape before the carrier tape is advanced, so that the adhesive tape, as it is taken up by the take-up unit, is not subjected to undue tension. In addition, since a length of the electronic-component tape is taken out from the supply reel by the dancing guide before the carrier tape is advance, and since the taken out electronic-component tape length is kept free (or under no-load condition) during the feed of the carrier tape, the carrier tape can be fed stably and reliably without causing rupture from the feed holes even when the electronic-component supply rate is increased or when a heavy supply reel is used.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for supplying electronic components one at a time to a loading position of an electronic component mounting machine, the electronic components being held on a carrier tape at a constant pitch by a pressure-sensitive adhesive tape, the carrier tape having two rows of feed holes formed along its opposite longitudinal edges at equal longitudinal intervals, the electronic components, the carrier tape and the adhesive tape jointly constituting an electronic-component tape, said apparatus comprising:

means for rotatably holding a supply reel on which the electronic-component tape is wound;

means for guiding the electronic-component tape as it is fed from said supply reel toward the loading position;

means for feeding the electronic components of the electronic-component tape one after another to the loading position, said feeding means including two rows of feed pins successively engageable with the rows of feed holes of the carrier tape and movable to advance the carrier tape intermittently by a distance equal to the pitch of the electronic components of the electronic-component tape; and means, operatively connected with said feeding means, moving from an initial position for taking out a predetermined length of the electronic-component tape from said supply reel and returning to said initial position before said feed pins advance the carrier tape to move a leading one of the electronic components into the loading position, thereby ceasing contact with and therefore relieving tension on said predetermined length of the electronic component tape.

2. An apparatus for supplying electronic components one at a time to a loading position of an electronic component mounting machine, the electronic components being held on a carrier tape at a constant pitch by a pressure-sensitive adhesive tape, the carrier tape having two rows of feed holes formed along its opposite longitudinal edges at equal longitudinal intervals, the electronic components, the carrier tape and the adhesive tape jointly constituting an electronic-component tape, said apparatus comprising:

means for rotatably holding a supply reel on which the electronic-component tape is wound;

means for guiding the electronic-component tape as it is fed from said supply reel toward the loading position;

means for feeding the electronic components of the electronic-component tape one after another to the loading position, said feeding means including two rows of feed pins successively engageable with the rows of feed holes of the carrier tape and movable to advance the carrier tape intermittently by a distance equal to the pitch of the electronic components of the electronic-component tape; and means operatively connected with said feeding means, moving from an initial position for taking out a predetermined length of the electronic-component tape from said supply reel before said feed pins advance the carrier tape to move a leading one of the electronic components into the loading position, said taking-out means being provided with a pivotally movable dancing guide disposed between said holding means and said feed means, said dancing guide being arranged to take out the predetermined length of the electronic-component tape and then be returned to its initial position prior to the feeding of the electronic-component tape to thereby cease contact with and therefore relieve tension on the predetermined length of the electronic component tape.

3. An apparatus for supplying electronic components one at a time to a loading position of an electronic component mounting machine, the electronic components being held on a carrier tape at a constant pitch by a pressure-sensitive adhesive tape, the carrier tape having two rows of feed holes formed along its opposite longitudinal edges at equal longitudinal intervals, the electronic components, the carrier tape and the adhesive tape jointly constituting an electronic-component tape, said apparatus comprising:

means for rotatably holding a supply reel on which the electronic-component tape is wound;

means for guiding the electronic-component tape as it is fed from said supply reel toward the loading position;

means for feeding the electronic components of the electronic-component tape one after another to the loading position, said feeding means including two rows of feed pins successively engageable with the rows of feed holes of the carrier tape and movable to advance the carrier tape intermittently by a distance equal to the pitch of the electronic components of the electronic-component tape; and means, operatively connected with said feeding means, for taking out a predetermined length of the electronic-component tape from said supply reel before said feed pins advance the carrier tape to more a leading one of the electronic components into the loading position, wherein said taking-out means is a pivotally movable dancing guide disposed between said holding means and said feed means, said dancing guide being releasably engageable with the electronic-component tape to take out said predetermined electronic-component tape length from said supply reel, and wherein said feed means includes a feed ratchet disposed adjacent to the loading position and having on its periphery a row of teeth and said two rows of feed pins, and a feed pawl normally engaged with said teeth of said feed ratchet and reciprocally movable to rotate said feed ratchet intermittently in one direction for advancing the carrier tape, said feed pawl being slidable on said teeth of said feed ratchet when it moves in the opposite direction, and wherein said dancing guide is operatively interlocked with said feed means such that while said feed pawl moves in said opposite direction, said dancing guide moves from a first position to a second position to engage the electronic-component tape and take out said predetermined electronic-component tape length, and in response to rotation of said feed ratchet in said one direction, said dancing guide moves from said second position to said first position to release the electronic-component tape, said dancing guide being normally disposed in said first direction.

4. An apparatus according to claim 3, wherein: said dancing guide has a guide surface engageable with the electronic-component tape to guide the same while said dancing guide is disposed in said first position.

5. An apparatus for supplying electronic components one at a time to a loading position of an electronic component mounting machine, the electronic components being held on a carrier tape at a constant pitch by a pressure-sensitive adhesive tape, the carrier tape having two rows of feed holes formed along its opposite longitudinal edges at equal longitudinal intervals, the electronic components, the carrier tape and the adhesive tape jointly constituting an electronic-component tape, said apparatus comprising:

means for rotatably holding a supply reel on which the electronic-component tape is wound;

means for guiding the electronic-component tape as it is fed from said supply reel toward the loading position;

means for feeding the electronic components of the electronic-component tape one after another to the loading position, said feeding means including two rows of feed pins successively engageable with the rows of feed holes of the carrier tape and movable to advance the carrier tape intermittently by a distance equal to the pitch of the electronic components of the electronic-component tape;

means, operatively connected with said feeding means, for taking out a predetermined length of the electronic-component tape from said supply reel before said feed pins advance the carrier tape to move a leading one of the electronic components into the loading position, means, operatively connected with said feed means, for separating the adhesive tape from the leading electronic component and the carrier tape during a time when the leading electronic component is stopped at the loading position and means, operatively connected with said feed means and disposed downstream of said separating means, for intermittently taking up the adhesive tape by said distance equal to the pitch of the electronic components of the electronic-component tape.

6. An apparatus according to claim 5, wherein said separating means includes concurrently movable first and second guide rollers spaced in a direction parallel to the direction of advance of the carrier tape, and a fixed third guide roller, said first, second and third guide rollers being arranged such that the adhesive tape is guided successively around said first guide roller, said second guide roller and said third guide roller while turning in alternate directions around the respective guide rollers, said first and second guide rollers being reciprocally movable in said direction between a first position in which said first guide roller is disposed downstream of the loading position and said second guide roller is disposed upstream of the loading position, and a second position in which said first and second guide rollers are disposed upstream of the loading position, said first and second guide rollers being normally disposed in said first position and being operated to move from said first position to said second position before the carrier tape is advanced by said feed pins.

7. An apparatus according to claim 6, wherein said first, second and third guide rollers are arranged such that a portion of the adhesive tape extending between said first guide roller and said second guide roller extends parallel to a portion of the adhesive tape extending between said second guide roller and said third guide roller.

8. An apparatus according to claim 6, wherein said feed means includes a feed ratchet disposed adjacent to the loading position and having on its periphery a row of teeth and said two rows of feed pins, and a feed pawl normally engaged with said teeth of said feed ratchet and reciprocally movable to rotate said feed ratchet intermittently in one direction for advancing the carrier tape, said feed pawl being slidable on said teeth of said feed ratchet when it moves in the opposite direction, wherein said separating means is operatively interlocked with said feed means such that said first and second guide rollers complete one cycle of reciprocation while said feed pawl is moving in said opposite direction, and wherein said taking-up means includes a take-up ratchet intermittently rotatable in one direction in synchronism with intermittent rotation of said feed ratchet for taking up the adhesive tape.

9. An apparatus for supplying electronic components one at a time to a loading position of an electronic component mounting machine, the electronic components being held on a carrier tape at a constant pitch by a pressure-sensitive adhesive tape, the carrier tape having two rows of feed holds formed along its opposition longitudinal edges at equal longitudinal intervals, the electronic components, the carrier tape and the adhesive tape jointly constituting an electronic-component tape, said apparatus comprising:

means for rotatably holding a supply reel on which the electronic-component tape is wound;

means for guiding the electronic-component tape as it is fed from said supply reel toward the loading position;

means for feeding the electronic components of the electronic-component tape one after another to the loading position, said feeding means including two rows of feed pins successively engageable with the rows of feed holes of the carrier tape and movable to advance the carrier tape intermittently by a distance equal to the pitch of the electronic components of the electronic-component tape;

means, operatively connected with said feed means, for separating the adhesive tape from the leading electronic component and the carrier tape during a time when the leading electronic component is stopped at the loading position; and means, operatively connected with said feed means and disposed downstream of said separating means, for intermittently taking up the adhesive tape by said distance equal to the pitch of the electronic components of the electronic-component tape.

10. An apparatus according to claim 9, wherein said separating means includes concurrently movable first and second guide rollers spaced in a direction parallel to the direction of advance of the carrier tape, and a fixed third guide roller, said first, second and third guide rollers being arranged such that the adhesive tape is guided successively around said first guide roller, said second guide roller and said third guide roller while turning in alternate directions around the respective guide rollers, said first and second guide rollers being reciprocally movable in said direction between a first position in which said first guide roller is disposed downstream of the loading position and said second guide roller is disposed upstream of the loading position, and a second position in which said first and second guide rollers are disposed upstream of the loading position, said first and second guide rollers being normally disposed in said first position and being operated to move from said first position to said second position before the carrier tape is advanced by said feed pins.

11. An apparatus according to claim 10, wherein said first, second and third guide rollers are arranged such that a portion of the adhesive tape extending between said first guide roller and said second guide roller extends parallel to a portion of the adhesive tape extending between said second guide roller and said third guide roller.

12. An apparatus according to claim 10, wherein said feed means includes a feed ratchet disposed adjacent to the loading position and having on its periphery a row of teeth and said two rows of feed pins, and a feed pawl normally engaged with said teeth of said feed ratchet and reciprocally movable to rotate said feed ratchet intermittently in one direction for advancing the carrier tape, said feed pawl being slidable on said teeth of said feed ratchet when it moves in the opposite direction, wherein said separating means is operatively interlocked with said feed means such that said first and second guide rollers complete one cycle of reciprocation while said feed pawl is moving in said opposite direction, and wherein said taking-up means includes a take-up ratchet intermittently rotatable in one direction in synchronism with intermittent rotation of said feed ratchet for taking up the adhesive tape.

* * * * *